(12) United States Patent
Olson et al.

(10) Patent No.: US 7,210,225 B2
(45) Date of Patent: May 1, 2007

(54) METHODS FOR CONTROLLING CONTACT HEIGHT

(75) Inventors: Stanley W. Olson, East Berlin, PA (US); Douglas M. Johnescu, York, PA (US); Stuart C. Stoner, Lewisberry, PA (US); Christopher G. Daily, Harrisburg, PA (US); Christopher J. Kolivoski, York, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 10/997,129

(22) Filed: Nov. 24, 2004

(65) Prior Publication Data

US 2005/0124187 A1 Jun. 9, 2005

Related U.S. Application Data

(60) Provisional application No. 60/528,103, filed on Dec. 9, 2003, provisional application No. 60/528,222, filed on Dec. 9, 2003.

(51) Int. Cl.
*H01R 12/00* (2006.01)
(52) U.S. Cl. .......................... 29/882; 439/66
(58) Field of Classification Search .................. 439/71, 439/66, 862, 736, 885; 29/882, 884; 324/754, 324/758
See application file for complete search history.

(56) References Cited

U.S. PATENT DOCUMENTS

| | | | | |
|---|---|---|---|---|
| 4,161,346 A | * | 7/1979 | Cherian et al. | 439/66 |
| 4,695,106 A | * | 9/1987 | Feldman et al. | 439/83 |
| 4,904,212 A | * | 2/1990 | Durbin et al. | 439/751 |
| 4,927,372 A | * | 5/1990 | Collier | 439/83 |
| 4,963,822 A | * | 10/1990 | Prokopp | 324/758 |
| 5,772,451 A | * | 6/1998 | Dozier et al. | 439/70 |
| 6,132,222 A | | 10/2000 | Wang et al. | |
| 6,328,573 B1 | * | 12/2001 | Sakata et al. | 439/66 |
| 6,442,831 B1 | * | 9/2002 | Khandros et al. | 29/843 |
| 6,488,513 B1 | * | 12/2002 | Neidich et al. | 439/66 |
| 6,561,817 B1 | * | 5/2003 | Ma | 439/66 |
| 6,741,085 B1 | * | 5/2004 | Khandros et al. | 324/754 |
| 6,764,313 B2 | * | 7/2004 | Hougham | 439/65 |
| 6,767,219 B2 | * | 7/2004 | Maruyama et al. | 439/66 |
| 6,843,659 B2 | * | 1/2005 | Liao et al. | 439/66 |
| 6,860,740 B2 | * | 3/2005 | Heigl | 439/65 |

* cited by examiner

*Primary Examiner*—Neil Abrams
(74) *Attorney, Agent, or Firm*—Woodcock Washburn LLP

(57) ABSTRACT

Methods for setting contact height in an electrical connector are disclosed. Each of a plurality of electrical contacts may be seated in a connector housing such that each contact has a respective initial height relative to the housing. At least one of the contacts is pressed on such that, after the pressing, each of the contacts has approximately the same height relative to the connector housing. The pressing may bend the at least one contact at least until it has set. Before the pressing, the initial contact heights have a first tolerance. After the pressing the pressed contact heights have a second tolerance that is smaller than the first tolerance. The pressing operation bends the contacts to a point that exceeds the yielding limit of the contact material, and may deform the contacts such that the several contacts have about the same contact height relative to the connector housing.

26 Claims, 9 Drawing Sheets

METHODS FOR CONTROLLING CONTACT HEIGHT

CROSS-REFERENCE TO RELATED APPLICATIONS

This application claims benefit under 35 U.S.C. § 119(e) of provisional U.S. patent application No. 60/528,103, filed Dec. 9, 2003, entitled "Methods For Controlling Contact Height," and of provisional U.S. patent application No. 60/528,222, filed Dec. 9, 2003, entitled "LGA-BGA Connector Housing And Contacts."

The subject matter disclosed and claimed herein is related to the subject matter disclosed and claimed in U.S. patent application Ser. No. 10/997,102, now U.S. Pat. No. 7,059,873, filed on even date herewith, entitled "LGA-BGA Connector Housing And Contacts.

The disclosure of each of the above-referenced patent applications is incorporated herein by reference in its entirety.

FIELD OF THE INVENTION

The invention relates generally to electrical connectors. More specifically, the invention relates to methods for controlling contact height that are particularly suitable for use in connection with the development and manufacture of land grid array connectors.

BACKGROUND OF THE INVENTION

Land grid array ("LGA") connectors and connectors utilizing ball grid arrays ("BGA") for attachment to printed circuit boards are known. For LGA-LGA and LGA-BGA connectors, there are two opposing interfaces and the contact positions on each interface must be tightly controlled. Adjusting one interface may affect the other.

A typical approach for tightly controlling contact position on both sides of the connector is to tightly control the tolerances of the components and the assembly. This approach is straightforward but expensive because one typically must severely limit manufacturing tolerances and impose the associated added costs.

It would be desirable, therefore, if methods were available for manufacturing such connectors without the need for so tightly controlling tolerances, such as, for example, on BGA tail length, LGA contact height, and the associated plastic housing.

SUMMARY OF THE INVENTION

An electrical contact may be seated into a first side of a plastic housing to a set height on the first side, which then determines the contact height on the opposite side. To reduce contact height variation, an operation may be performed to press on the distal ends of a plurality of such contacts. If the contacts are bent to a point that exceeds the yield limit of the material from which the contact beam is made, the contacts will yield, taking a set, and not returning to their initial starting height. The contacts having a greater initial height will be depressed further, yield sooner, and take more set, than those having a lesser initial height. After the pressing, all the contacts return to nearly the same height, thus achieving desired "z-axis" tolerance levels. Thus, the pressing operation may deform the contacts such that the several contacts have about the same contact height relative to the connector housing.

A method according to the invention provides a mechanism by which nearly uniform contact height may be achieved for a plurality (e.g., tens or hundreds) of contacts. Such methods may also be used to position the contacts in a lateral direction in order to control the location and alignment of the contacts with respective pads. The amount of contact wipe may also be controlled so that when the contacts move as a result of deflection, the contact points stay on the respective pads. That is, the contacts may be bent such that a desired contact wipe is achieved.

DETAILED DESCRIPTION OF ILLUSTRATIVE EMBODIMENTS

A method according to the invention for setting contact height in an electrical connector may include seating each of a plurality of electrical contacts in a connector housing such that each electrical contact has a respective initial contact height relative to an interface side of the connector housing, and pressing on at least one of the contacts such that, after the pressing, each of the contacts has approximately the same contact height relative to the interface side of the connector housing.

Figure 1:
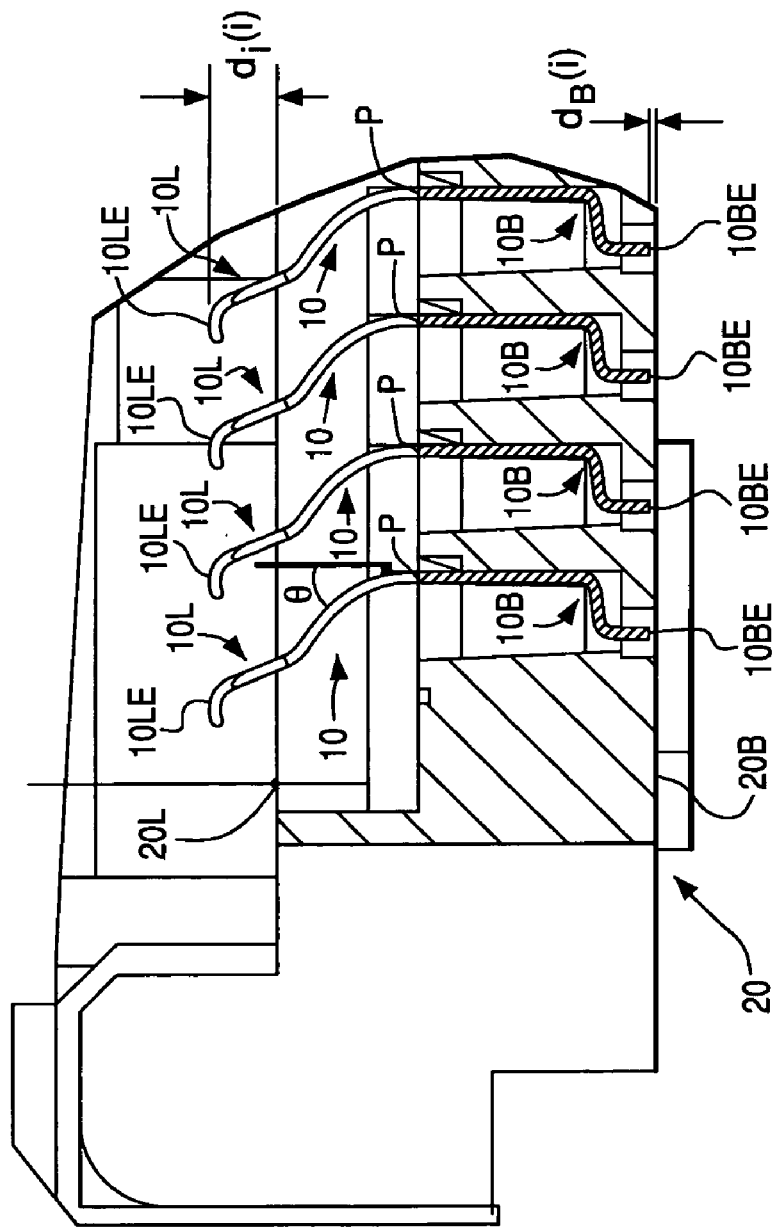
FIG. 1 is a cross-sectional view of an electrical connector showing initial tolerances.

As shown in FIG. 1, a plurality of electrical contacts 10 may be seated in a connector housing 20. The contacts 10 depicted in FIG. 1 are LGA-BGA contacts. That is, a first portion 10B of each contact 10 is adapted for use as a BGA connector contact and a second portion 10L, which is opposite the first portion 10B, is adapted for use as an LGA connector contact. Though the contacts 10 depicted in FIG. 1 are LGA-BGA contacts, it should be understood that the methods of the invention may be applied to other types of contacts, such as LGA-LGA, through-hole, j-lead, or any surface mount contacts, for example.

The BGA portions 10B of the contacts 10 may be seated in the connector housing 20 such that the BGA tail end 10BE of each contact 10 is recessed a respective distance $d_B(i)$ from a first (e.g., BGA or board mating) interface side 20B of the connector housing 20. Preferably, the contacts are seated such that the BGA tail ends are all nearly the same distance from the BGA interface side of the housing. In an embodiment of the invention, the BGA tail ends 10BE of the BGA contact portions 10B may be recessed a distance $d_B(i)$ of about 0.05 mm from the BGA interface side 20B of the connector housing 20, with a tolerance of about 0.09 mm. That is, the contacts 10 may be seated such that the BGA tail end 10BE of each contact 10 is recessed a distance $d_B(i)$ of about 0.05±0.09 mm from the BGA interface side 20B of the connector housing 20.

Preferably, each contact 10 has a contact alignment slot that extends into a body portion of the contact 10. Contacts having such alignment slots are described in detail in U.S. Pat. No. 7,059,873. Preferably, the contacts 10 are pressed into respective contact receiving wells in the connector housing 20 until the ends of the alignment slots are generally even with the plane 20P depicted in FIG. 1. The contact may be bent at the point P where it comes out of the housing 20 because the housing acts as a mandrel against which the contact may be bent.

After the contacts 10 have been seated, each of the LGA distal ends 10LE may extend a respective distance $d_i(i)$ from a second (e.g., LGA) interface side 20L of the connector 20. Thus, each contact 20 has an initial contact height $d_i(i)$, measured relative to the plane of the LGA interface side 20L. In an embodiment of the invention, the distal ends 10LE of the LGA contact portions 10L of the contacts 10 may extend to a contact height $d_i(i)$ of about 0.62 mm from the LGA interface side 20L of the housing 20, with a tolerance $\Delta d_i$ of about 0.21 mm. That is, the contacts 10 may be seated such that the LGA distal end 10LE of each contact 10 extends about 0.62±0.21 mm from the LGA interface side 20L of the connector housing 20.

Thus, each of the plurality of electrical contacts 10 may be seated in the connector housing 20 such that each contact 10 has a respective initial contact height $d_i(i)$ relative to the connector housing 20, the initial contact heights $d_i(i)$ of the plurality of electrical contacts 10 having a relatively wide first tolerance.

Figure 2:
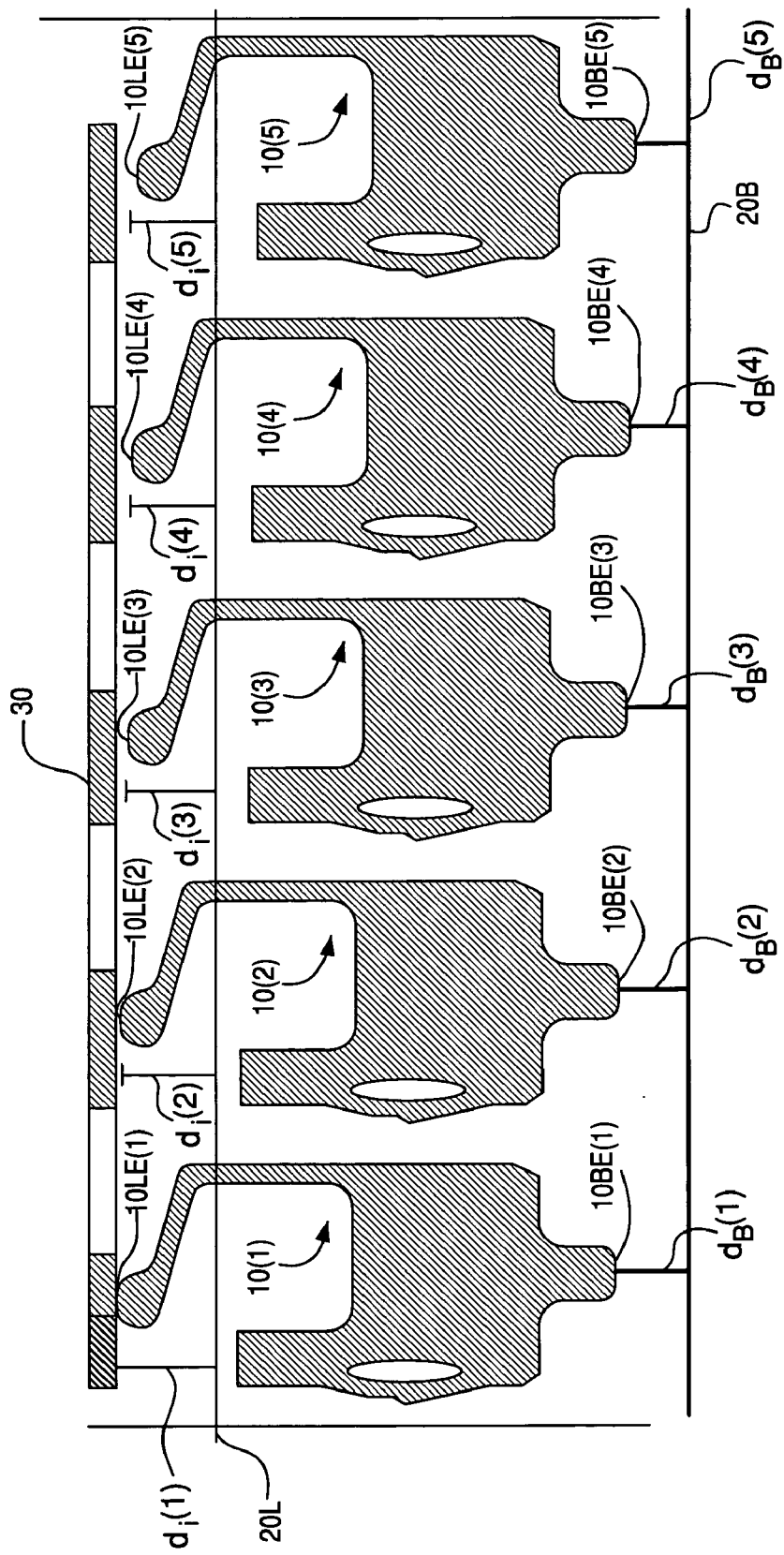
FIG. 2 shows the initial starting height of the contacts.

FIG. 2 depicts example initial heights $d_i(i)$ of a plurality of contacts 10(i) after seating in a connector housing 20. Note that the contacts shown in FIGS. 2 through 6 differ from the contacts depicted in FIG. 1 in that FIGS. 2 through 6 depict merely stamped contacts for illustration purposes, while FIG. 1 depicts formed contacts. As shown, the BGA tail end 10BE(1) is recessed a distance $d_B(i)$ of about 0.20 mm from the BGA interface side 20B of the connector housing 20. Similarly, BGA tail ends 10BE(2), (3), (4), and (5) are recessed 0.15, 0.10, 0.05, and 0.00 mm, respectively. Though the contacts 10(i) depicted in FIGS. 2 through 6 are shown, for purposes of illustration, with their respective BGA tail ends 10BE(i) recessed by different amounts, it is desirable that these recesses should all be about the same.

A pressing plate 30, which may be generally planar and made preferably of metal, may be moved toward the distal ends 10LE(i) of the contacts until the pressing plate 30 is in abutment with the distal end 10LE(1) of contact 10(1), which, as depicted in FIG. 2, is the contact having the greatest initial contact height $d_i(i)$. As the pressing member is generally planar, the pressing plate 30 is 0.05, 0.10, 0.15, and 0.20 mm away from the distal ends 10LE(2), (3), (4), and (5) of contacts 10(2), (3), (4), and (5), respectively, the pressing plate 30 initially moves into abutment with the distal end 10LE(1) of contact 10(1). The pressing plate 30 then continues to be moved nearer to the LGA interface side 20L of the housing, pressing on the contacts 10 and causing the contacts 10 to bend at or near the points P where the the LGA portions 10L of the contacts meet the housing.

It is expected that the methods of the invention may be applied to connectors having tens or hundreds of contacts disposed in an arrayed configuration. According to the invention, an entire such array of contacts may be depressed at the same time using a planar pressing member that is large enough to cover the entire array (or any part of the array for which depression is desired).

Figure 3:
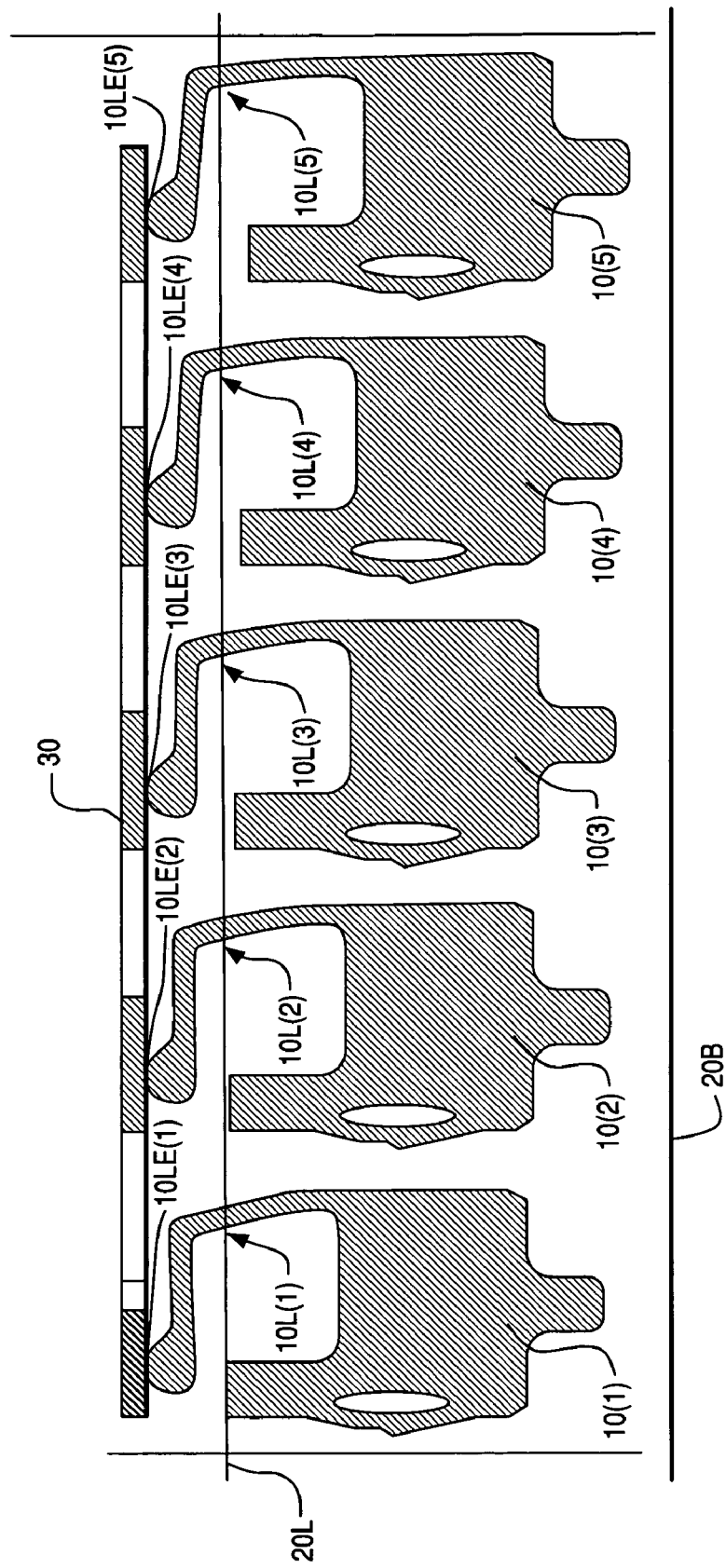
FIG. 3 shows the contacts at full depression.

FIG. 3 shows the contacts 10(i) at full depression, i.e., with the pressing plate 30 moved, relative to its position as shown in FIG. 2, 0.40 mm toward the LGA interface side 20L of the housing. As shown, at this juncture, the LGA portion 10L(1) of contact 10(1) has been bent (rotationally toward the LGA interface side 20L of the housing) such that its distal end 10LE(1) has moved 0.40 mm toward the LGA interface side 20L of the housing. Similarly, the LGA portion 10L(5) of contact 10(5) has been bent such that its distal end 10LE(5) has moved 0.20 mm toward the LGA interface side 20L of the housing 20. The stress diagrams show that there is generally more stress on the LGA portion 10L(1) of contact 10(1) than on the LGA portion 10L(5) of the contact 10(5).

It should be understood that the pressing plate 30 could press the distal ends 10LE of the contacts 10 for a certain, predefined distance, or until the distal ends of one or more of the contacts are within a certain, predefined distance of the LGA interface side 20L of the connector housing. It should also be understood that, depending on the actual range of contact heights after seating, the pressing plate 30 could cause anywhere from zero to all of the contacts to be deformed.

Figure 4:
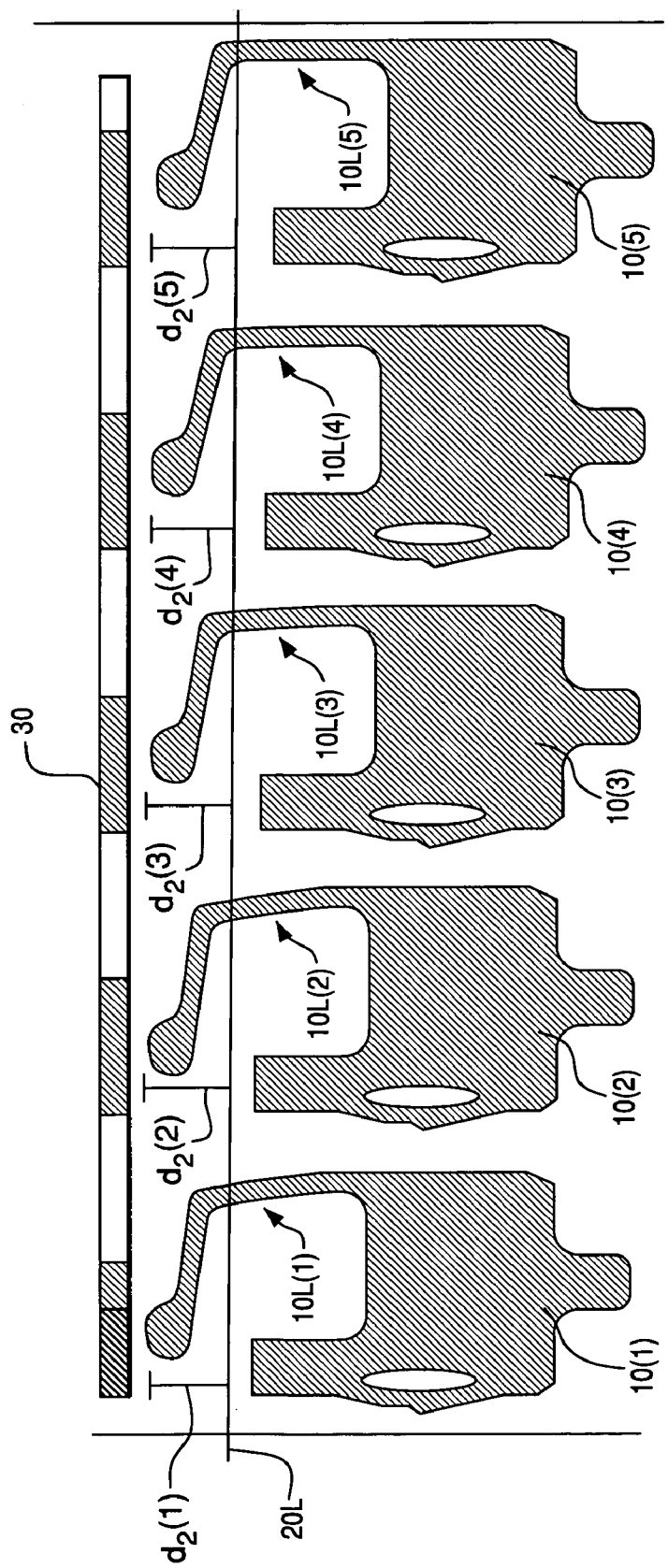
FIG. 4 shows the post setting height.

FIG. 4 shows the post setting heights $d_2(i)$ on the contacts 10(i) after the pressing plate 30 is pulled away from the contacts 10(i) after the first pressing cycle. It should be understood that, after the pressing plate 30 is pulled away from the contacts 10(i), the contacts 10(i) will spring back (i.e., rotate away from the LGA interface side 20L of the housing). If a contact 10(i) has been bent enough to cause the contact to yield and set, however, the contact 10(i) will not return to its original position.

As shown in FIG. 4, the first pressing cycle (depicted in FIG. 3) may be sufficient to cause one or more of the contacts 10(i) to yield and set. Consequently, the respective intermediate contact heights $d_2(i)$ may be smaller than the corresponding initial contact heights $d_i(i)$ depicted in FIG. 2. Thus, any (or all) of the contacts 10(i) may be bent until it has yielded and set at a contact height $d_2(i)$ that is less than its initial contact height $d_i(i)$. Note that the residual stress on the LGA portions 10L(i) of the contacts 10(i) (i.e., the stress remaining on the LGA portions 10L(i) of the contacts 10(i) after the pressing member 30 has been pulled away) is much less than the maximum stress they endured during the first pressing cycle (i.e., at full depression). As shown in FIG. 4, the first pressing cycle (depicted in FIG. 3) may be sufficient to cause one or more of the contacts 10(i) to yield and set.

Figure 5:
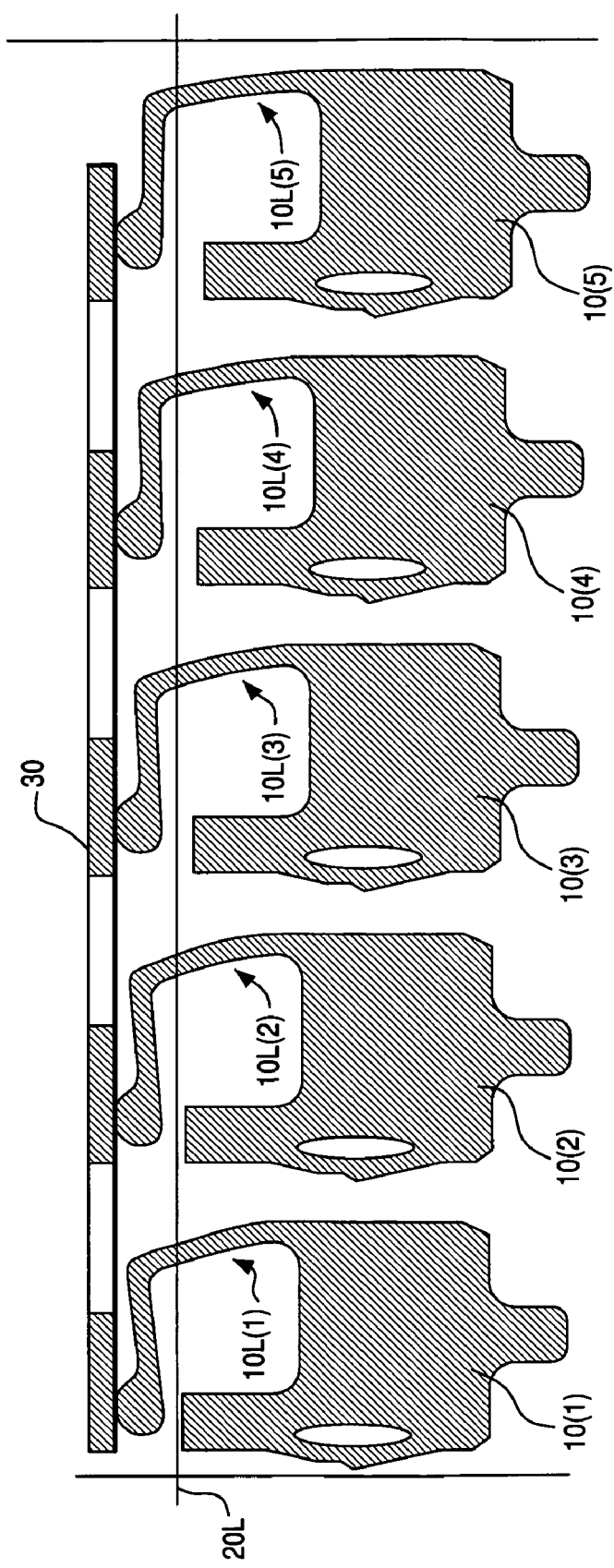
FIG. 5 shows the contacts after additional depression.

If a single pressing cycle is insufficient to bring the contact heights into tolerance, then one or more subsequent pressing cycles may be employed. FIG. 5 shows the contacts 10(i) at full depression during a second pressing cycle, in which the pressing plate 30 has been moved nearer to the LGA interface side 20L of the housing 20 than it had been during the first pressing cycle. Thus, the LGA portions 10L(i) of the contacts 10(i) may be bent farther such that the LGA distal ends 10LE(i) are pressed closer to the LGA interface side 20L of the connector housing than they had been during the first pressing cycle (depicted in FIG. 3). Accordingly, some contacts that did not yield and set after a first pressing may be made to yield and set by virtue of one or more subsequent pressings.

Figure 6:
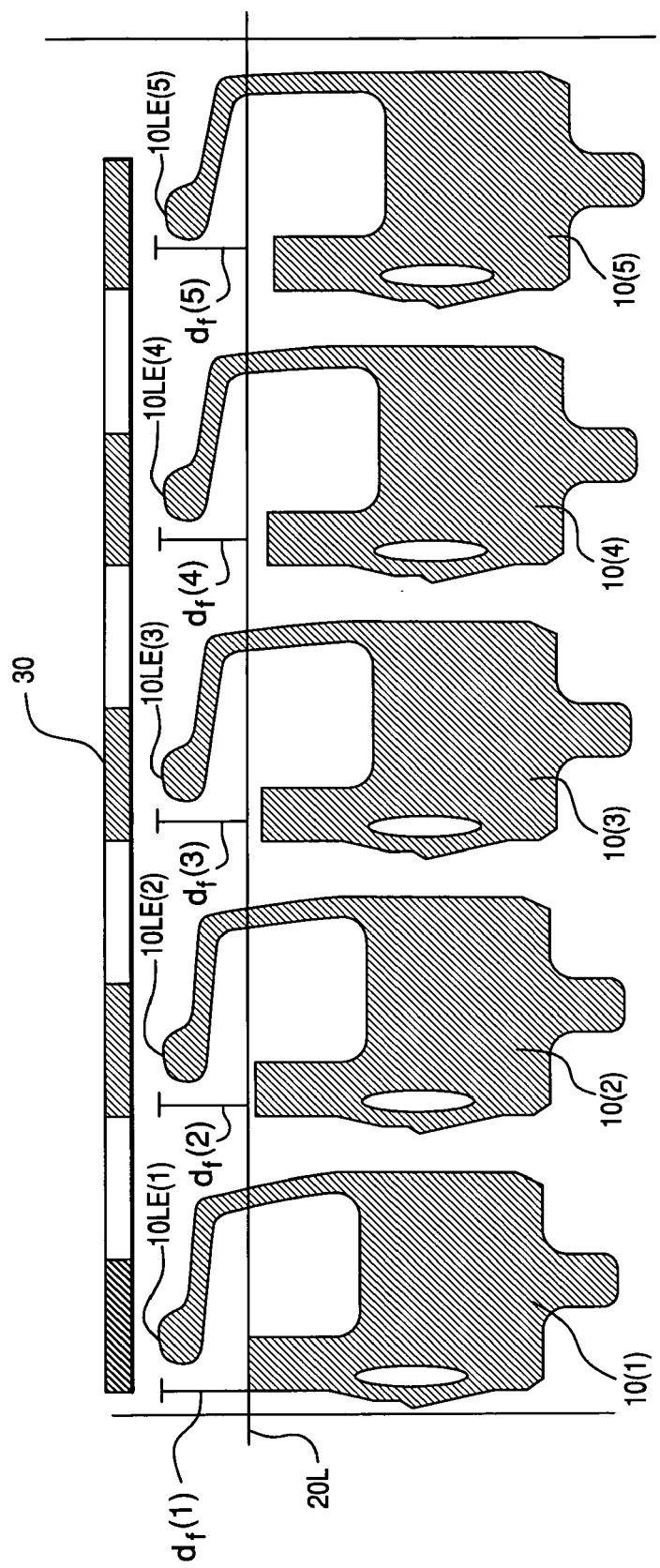
FIG. 6 shows the contacts after the second setting.

FIG. 6 shows the post setting heights $d_f(i)$ on the contacts 10(i) after the subsequent pressing and withdrawal of the pressing member 30. As shown, the LGA ends 10LE(i) are set nearer to the LGA interface side 20L of the connector housing than they were after the first pressing. Also, the respective contact heights $d_f(i)$ are all about the same.

Figure 7:
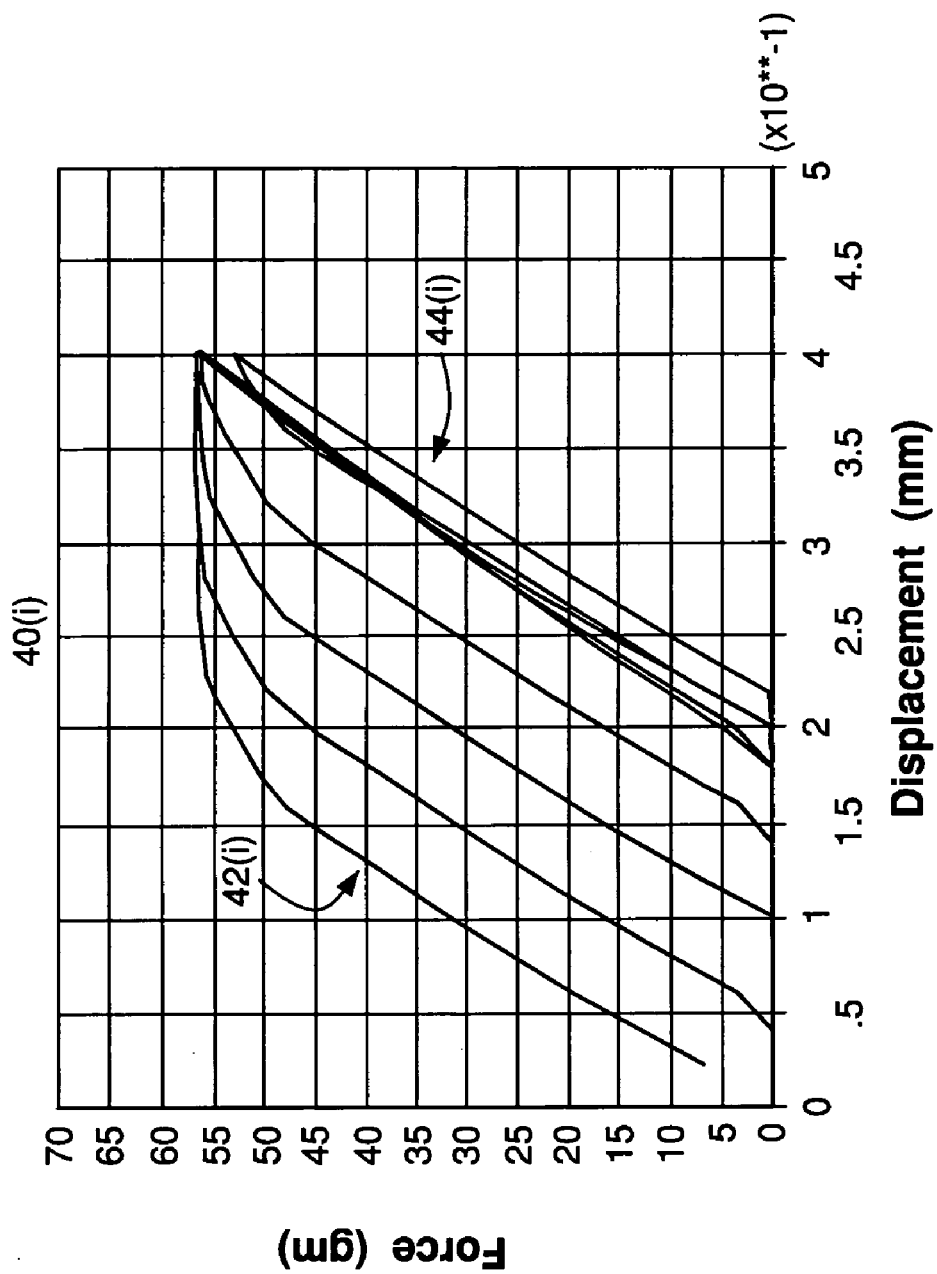
FIG. 7 shows a force displacement curve for the initial depression shown in FIG. 3.

FIG. 7 provides respective force vs. displacement curves 40(i) corresponding to each of the contacts 10(i) for the initial depression depicted in FIG. 3. As shown, the compression curves 42(i) are distinct and separate. The return curves 44(i), however, are close and overlapping. This indicates that, during the first depression by the pressing member 30, the LGA ends of the contacts moved by different amounts toward the LGA interface side of the connector housing, but that, after the pressing member was withdrawn, they moved back away from the LGA interface side of the connector housing by nearly the same amount. That is, even though the LGA ends of the contacts started out at different distances from the LGA interface side of the connector housing before the first depression, they ended up at nearly the same distance from the LGA interface side of the connector housing after the first depression.

Figure 8:
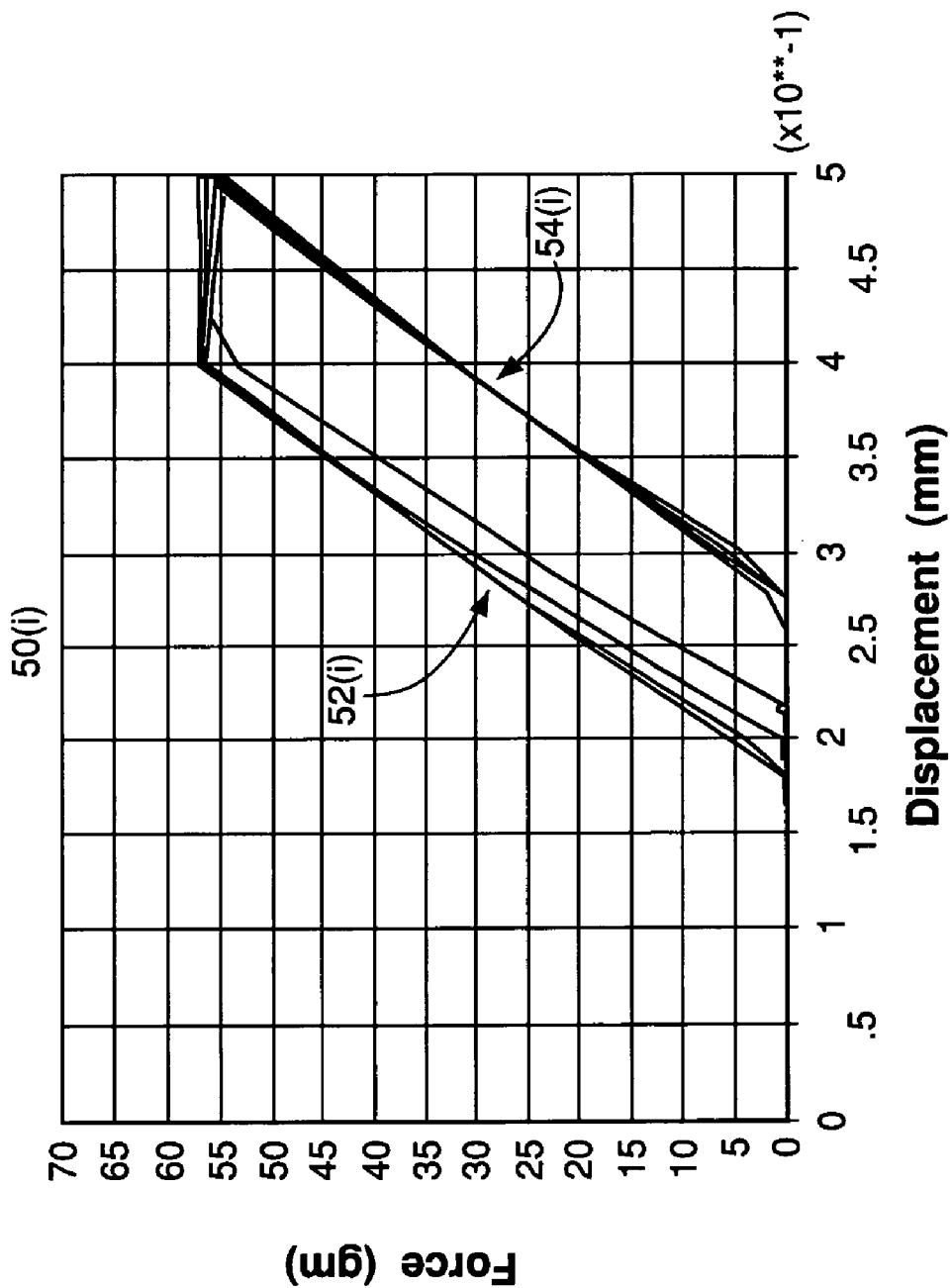
FIG. 8 shows a force displacement curve for the second depression shown in FIG. 5.

FIG. 8 provides respective force vs. displacement curves 50(i) corresponding to each of the contacts 10(i) for the second depression depicted in FIG. 5. As shown, the compression curves 52(i) are close and overlapping, and the return curves 54(i) are nearly one. This indicates that, during the second depression, the LGA ends of the contacts were still moving by different amounts toward the LGA interface side of the connector housing (because they were different distances away from the LGA interface side to start). After the pressing member was withdrawn, however, they moved back away from the LGA interface side of the connector housing by almost exactly the same amount. That is, even though the LGA ends of the contacts were still at different distances from one another after the first depression, they ended up at almost exactly the same distance from the LGA interface side of the connector housing after the second depression.

Figure 9:
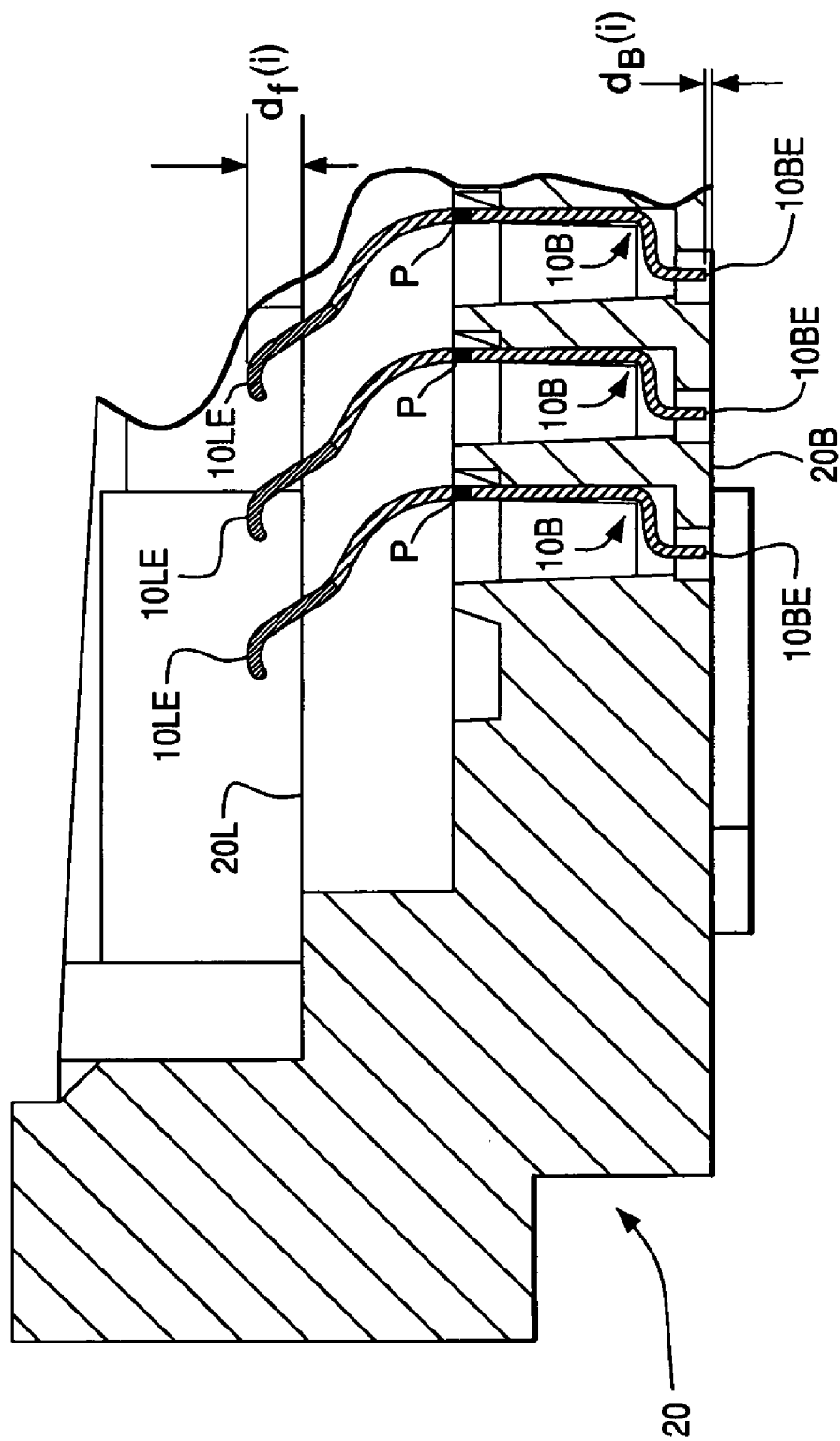
FIG. 9 is a cross-sectional view of the electrical connector of FIG. 1 showing final tolerances.

FIG. 9 is a cross-sectional view of the electrical connector of FIG. 1 after completion of the final pressing cycle. As shown, the BGA tail ends 10BE of the BGA contact portions 10B remain recessed a distance $d_B(i)$ of about 0.05 mm from the BGA interface side 20B of the connector housing 20, with a tolerance of about 0.09 mm. The distal ends 10LE of the LGA contact portions 10L of the contacts 10, however, now extend to a contact height $d_f(i)$ of about 0.45 mm from the LGA interface side 20L of the housing 20, with a tolerance of about 0.05 mm. Thus, the tolerance after the pressing operation is smaller than the tolerance before the pressing operation. Thus, the contacts 10(i) may be pressed such that, after the pressing, each of the contacts 10(i) has a respective pressed contact height $d_f(i)$ relative to the connector housing 20, the pressed contact heights $d_f(i)$ of the plurality of electrical contacts 10(i) having a second tolerance that is smaller than the first tolerance.

It is to be understood that the foregoing illustrative embodiments have been provided merely for the purpose of explanation and are in no way to be construed as limiting of the invention. Words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention in its aspects.

For example, it should be understood that, although the invention has been described in connection with a BGA-LGA connector, the principles of the invention may be applied to an LGA-LGA connector. Further, to minimize variation at both LGA interfaces, the method of the invention could be performed either independently or simultaneously to both LGA interfaces.

Further, it should be understood that the contact geometry and material used may affect the bending, yielding, and setting properties of the contacts. Also, the contact geometry may be designed for improved wipe—i.e., to ensure that the contacts remain on their respective pads after bending.

What is claimed is:

1. A method for setting contact height in an electrical connector, the method comprising:

seating respective retention portions of first and second electrical contacts in separate contact wells of a connector housing such that each of said first and second electrical contacts has a respective mating end extending from a first end of the connector housing and a respective mounting end recessed within a second end of the connector housing that is opposite the first end thereof, wherein each said mating end is adapted to receive an electrical device, and each said mating end has a respective initial contact height relative to the connector housing, wherein the first and second electrical contacts are made of a material having only one stress-strain yield point; and pressing simultaneously on each said mating end in a direction toward said connector housing while the first and second contacts are unconnected from any electrical device such that, after the pressing, each said mating end has an approximately similar respective pressed contact height relative to said connector housing, wherein pressing on the mating ends comprises pressing on the mating ends at least until each of the first and second electrical contacts bends to a point exceeding the yield point and sets at the point.

2. The method of claim 1, wherein pressing on the mating end of the first electrical contact comprises bending the mating end of the first electrical contact a predefined distance.

3. The method of claim 1, wherein pressing on the mating end of the first electrical contact comprises bending the mating end of the first electrical contact until a distal end of the first electrical contact is approximately a predefined distance from the connector housing.

4. The method of claim 3, further comprising pressing on and bending the mating end of the second electrical contact until a distal end of the second electrical contact is approximately the predefined distance from the connector housing.

5. The method of claim 1, wherein the respective initial contact heights of the first and second electrical contacts have a respective first tolerance, and wherein, after the simultaneous pressing, each of the first and second electrical contacts have a respective pressed contact height relative to the connector housing, the respective pressed contact heights of the first and second electrical contacts having a second tolerance that is smaller than the first tolerance.

6. The method of claim 1, wherein each said mounting end is adapted to receive a solder ball, wherein the solder ball would thereby extend from the connector housing.

7. The method of claim 1, wherein the pressing is performed with a tool having no circuit function.

8. The method of claim 1, wherein the pressing bends at least one of the mating ends beyond a yield limit of the respective electrical contact, the respective mating end not returning to the initial contact height after the pressing.

9. A method for setting contact height in an electrical connector, the method comprising:

seating first and second electrical contacts in a connector housing such that each of the first and the second electrical contacts has a respective center portion fixed within the connector housing, and has a respective mating end extending from the connector housing, the respective mating end being acutely angled in relation to a first surface of the connector housing, each said mating end having a respective initial contact height relative to the first surface of the connector housing, the respective initial contact heights of the mating ends of the first and the second electrical contacts having a respective first tolerance, wherein the first and second electrical contacts are made of a material having only one stress-strain yield point; and pressing on at least the mating end of the first electrical contact until exceeding the yield point of the first electrical contact while the first electrical contact is unconnected from an electrical device such that, after the pressing, each of the mating ends of the first and the second electrical contacts has a respective pressed contact height relative to the first surface of the connector housing, the respective pressed contact height of each of the mating ends of the first and the second electrical contacts having a second tolerance that is smaller than the first tolerance.

10. The method of claim 9, wherein pressing on the mating end of the first electrical contact comprises pressing on a distal end of the first electrical contact.

11. The method of claim 9, wherein seating the first and second electrical contacts comprises seating the first and second electrical contacts such that the first electrical contact has an initial contact height that is greater than the initial contact height of the second electrical contact.

12. The method of claim 9, wherein pressing on the mating end of the first electrical contact comprises bending the first electrical contact a predefined distance.

13. The method of claim 9, wherein pressing on the mating end of the first electrical contact comprises bending the first electrical contact until a distal end of the first electrical contact is approximately a predefined distance from the connector housing.

14. The method of claim 13, further comprising pressing on the mating end of and bending the second electrical contact until a distal end of the second electrical contact is approximately the predefined distance from the connector housing.

15. The method of claim 9, wherein the first and second electrical contacts are each seated in a separate contact receiving well.

16. The method of claim 9, wherein each of the first and the second electrical contacts also have a respective mounting end recessed within the connector housing and adapted to receive a solder ball, whereby the solder ball would extend from the connector housing.

17. A method for setting contact height in an electrical connector, the method comprising:

seating a first electrical contact in a connector housing such that the first electrical contact has a first stem extending therefrom, the first stem having an initial contact height, and being acutely angled, relative to the connector housing wherein the first stem is made of a material having only one stress-strain yield point; and bending the first stem, while the first electrical contact is unconnected from an electrical device, until the first stem has bent beyond the yield point of the first stem and set such that, after the bending, the first stem has a contact height relative to the connector housing that is less than the initial contact height.

18. The method of claim 17, wherein bending the stem of the electrical contact comprises pressing on a distal end of the electrical contact.

19. The method of claim 17, further comprising seating a second electrical contact in the connector housing such that the second electrical contact has a second stem extending therefrom, the second stem having an initial contact height that is less than the initial contact height of the first stem.

20. The method of claim 17, wherein bending the first stem comprises bending the first stem a predefined distance.

21. The method of claim 17, wherein bending the first stem comprises bending first stem until a distal end of the first electrical contact is approximately a predefined distance from the connector housing.

22. The method of claim 21, further comprising seating a second electrical contact in the connector housing, and pressing on and bending a second stem of the second electrical contact until a distal end of the second electrical contact is approximately the predefined distance from the connector housing.

23. The method of claim 17, wherein the first electrical contact is seated in a contact receiving well.

24. A method for setting contact height in an electrical connector, the method comprising:

seating a first electrical contact and a second electrical contact in a connector housing, a center portion of the first and the second electrical contacts being fixed therein, wherein the first electrical contact and the second electrical contact each has a respective tab that extends therefrom at an acute angle with respect to a first surface of the connector housing, each tab has a respective initial contact height defined between the tab and the first surface of the connector housing, and the respective initial contact height of the tab of said first electrical contact is not substantially equal to the respective initial contact height of the tab of the second electrical contact, wherein the first electrical contact and the second electrical contact are made from a material having only one stress-strain yield point;

applying, after the seating step, a uniformly distributed compression force simultaneously to the tab of the first electrical contact and the tab of the second electrical contact in a direction toward the first surface of the connector housing; and relieving the compression force applied to the tab of the first electrical contact and the tab of the second electrical contact, wherein at least one of the tabs was bent and set beyond the yield point of the respective contact, and wherein a final first contact height defined between the tab of the first electrical contact and the first surface of the connector housing substantially equals a final second contact height defined between the tab of the second electrical contact and the first surface of the connector housing after the step of relieving the compression force and prior to electrically connecting the tabs to an electrical device.

25. The method of claim 24, wherein the compression force is applied with a tool having no circuit function.

26. The method of claim 24, wherein the compression force bends at least one of the tabs beyond the yield point of the respective electrical contact, the tab not returning to the respective initial contact height after application of the compression force.

* * * * *